(12) United States Patent
Taniguchi et al.

(10) Patent No.: US 7,113,588 B2
(45) Date of Patent: Sep. 26, 2006

(54) INPUT-OUTPUT BALANCED FILTER

(75) Inventors: Tetsuo Taniguchi, Takefu (JP); Naoki Mizoguchi, Takefu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/966,433

(22) Filed: Oct. 15, 2004

(65) Prior Publication Data

US 2005/0053226 A1 Mar. 10, 2005

Related U.S. Application Data

(63) Continuation of application No. 09/228,562, filed on Jan. 12, 1999.

(30) Foreign Application Priority Data

Jan. 14, 1998 (JP) .................................. 10-5942

(51) Int. Cl.
*H04M 1/00* (2006.01)
(52) U.S. Cl. ...................... 379/387; 333/175; 333/202
(58) Field of Classification Search ........ 333/167–185, 333/219, 219.1, 219.2
See application file for complete search history.

(56) References Cited

U.S. PATENT DOCUMENTS

| 4,926,147 A | 5/1990 | Oppelt |
| 5,124,675 A | 6/1992 | Komazaki et al. |
| 5,132,647 A | 7/1992 | Lopez et al. |
| 5,140,497 A * | 8/1992 | Kato et al. ............... 361/321.1 |
| 5,483,683 A | 1/1996 | Burrage |
| 5,910,756 A * | 6/1999 | Ella ........................... 333/133 |

FOREIGN PATENT DOCUMENTS

| JP | 52-50605 | 4/1977 |
| JP | 60-139330 | 9/1985 |
| JP | 62-206914 | 9/1987 |
| JP | 02-067810 | 3/1990 |
| JP | 4-200107 | 7/1992 |
| JP | 4-372213 | 12/1992 |
| JP | 5-48365 | 2/1993 |
| JP | 5-347528 | 12/1993 |
| JP | 6-164289 | 6/1994 |
| JP | 08-018375 | 1/1996 |

* cited by examiner

*Primary Examiner*—Sinh Tran
*Assistant Examiner*—Walter F Briney, III
(74) *Attorney, Agent, or Firm*—Keating & Bennett, LLP

(57) ABSTRACT

An input-output balanced filter has a greatly reduced size and excellent stable electric characteristics. The input-output balanced filter includes two LC bandpass filter circuit units. A first LC bandpass filter circuit unit has a circuit structure in which a first LC parallel resonant circuit including an inductor and a capacitor is connected to a second LC parallel resonant circuit including an inductor and a capacitor via a connecting capacitor, while the second LC bandpass filter circuit unit has a circuit structure in which a third LC parallel resonant circuit including an inductor and a capacitor is connected to a fourth LC parallel resonant circuit including an inductor and a capacitor via the other connecting capacitor; and, the common side lines of the two LC bandpass filter circuit units are connected to each other via a connecting inductor which functions as a common line.

20 Claims, 7 Drawing Sheets

[FIG. 1]

[FIG. 3]
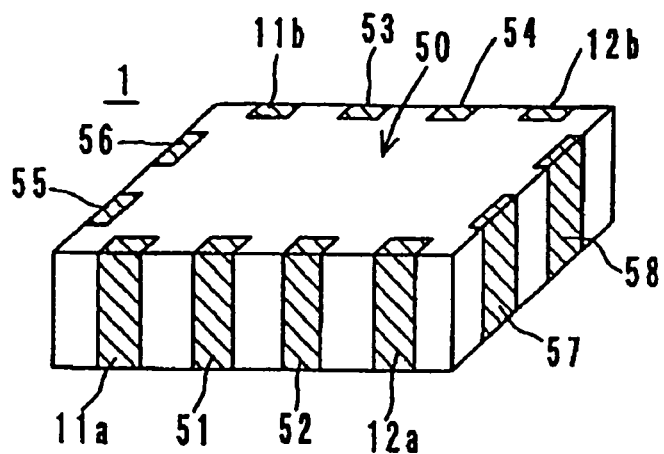
[FIG. 4]
[FIG. 5]
[FIG. 6]
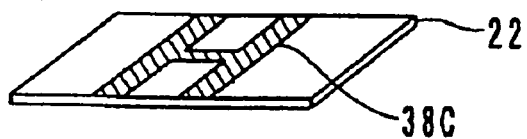
[FIG. 7]
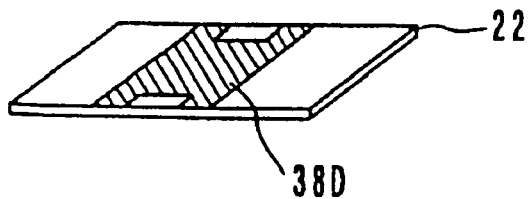

[FIG. 8]
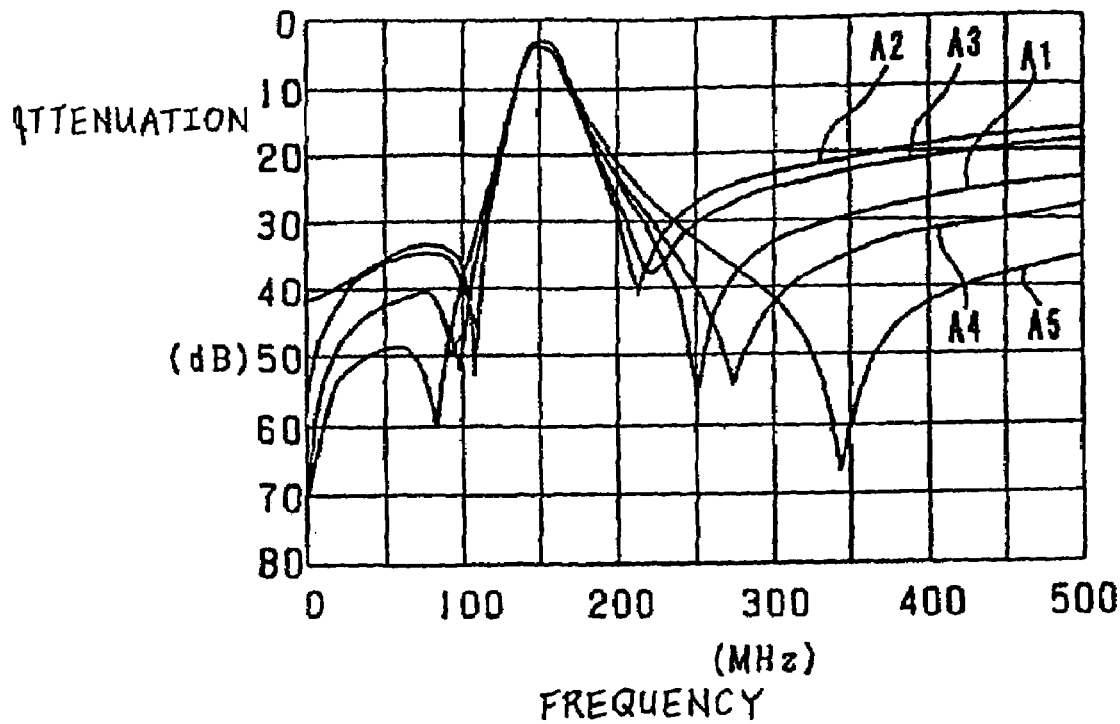
[FIG. 9]
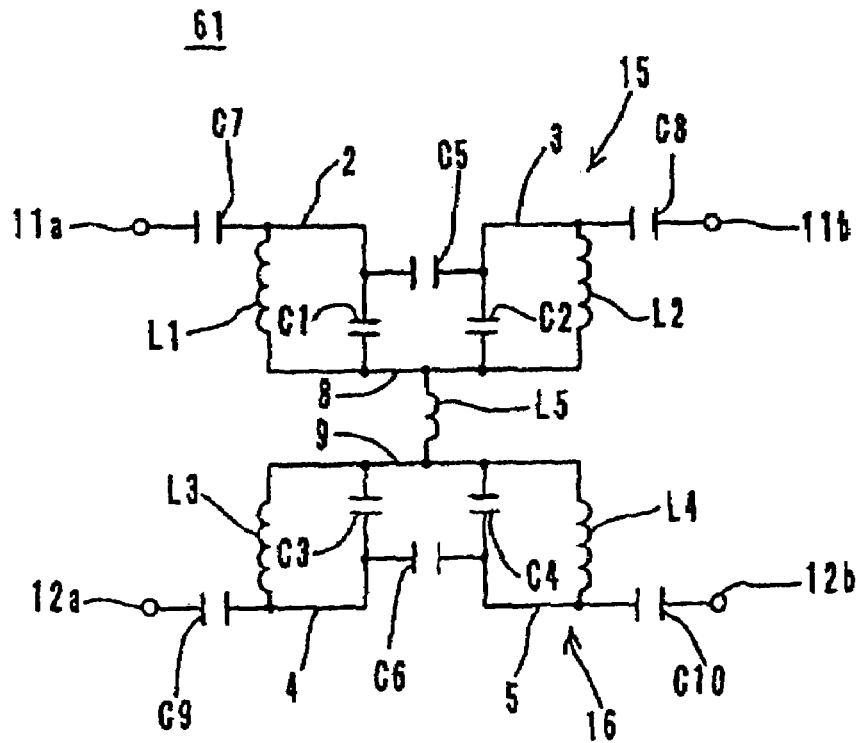

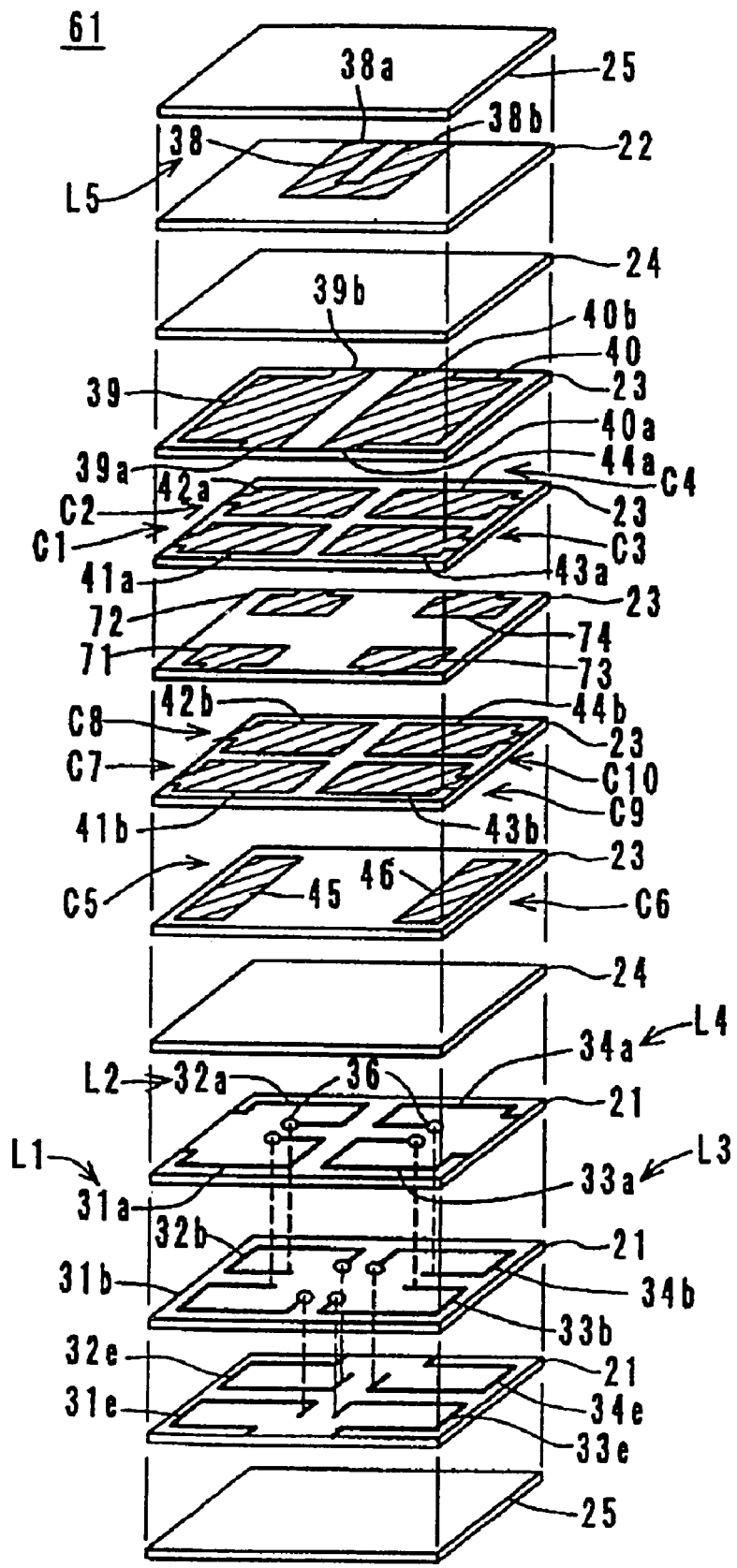
[FIG. 10]

[FIG. 11]
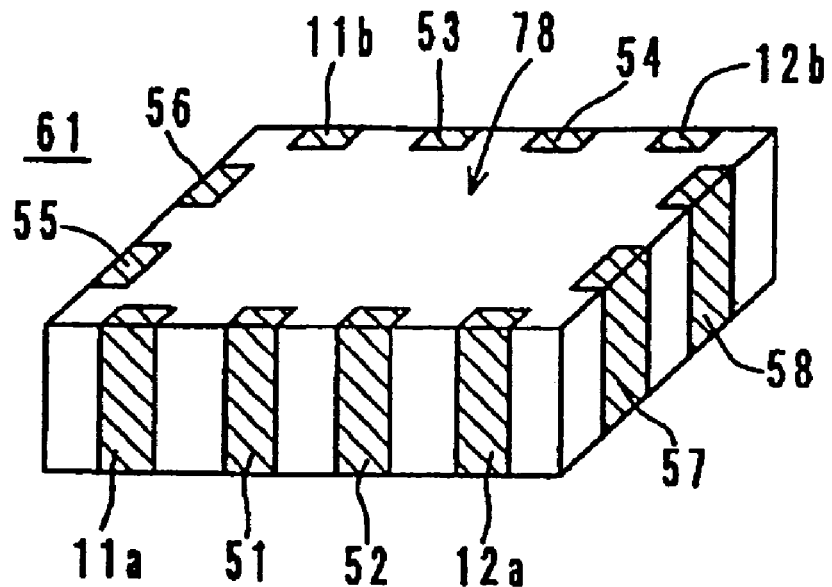
[FIG. 12]
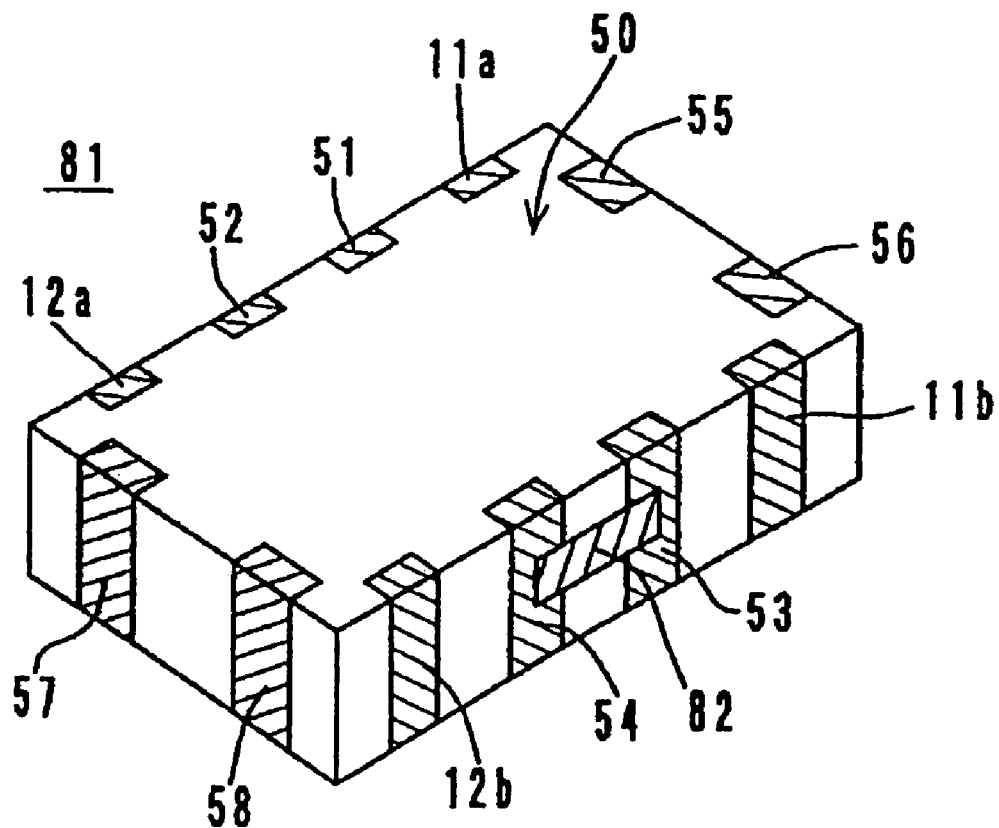

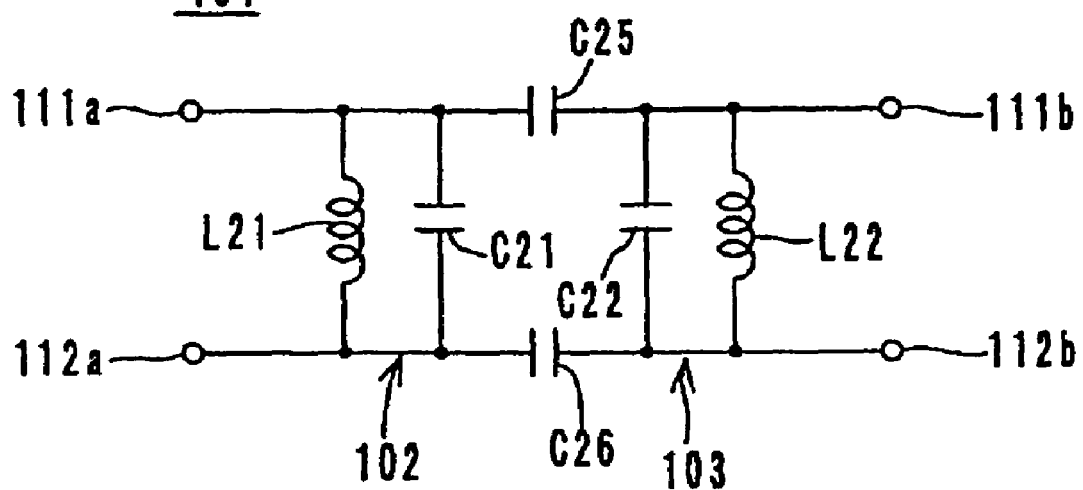
[FIG. 13]

INPUT-OUTPUT BALANCED FILTER

This application is a Continuation of U.S. patent application Ser. No. 09/228,562 filed Jan. 12, 1999, currently pending.

BACKGROUND OF THE INVENTION

1. Field of the Invention

The present invention relates to an input-output balanced filter, and more particularly, to input-output balanced filters incorporated in communication equipment or the like, such as cellular phones and automobile phones, etc.

2. Description of the Related Art

In general, communication equipment such as a cellular phone, an automobile phone, and the like, use a differential filter or an input-output balanced filter adapted to function both as a filter and an impedance transformer, arranged between the stages of a mixer and a modulator in a transmitting circuit. As a conventional type of input-output balanced filter, a filter shown in the current equivalent circuit diagram of FIG. 13 is known. The filter 101 has a circuit structure in which an LC parallel resonant circuit 102 including an inductor L21 and a capacitor C21, and an LC parallel resonant circuit 103 including an inductor L22 and a capacitor C22 are connected via connecting capacitors C25 and C26. In the filter 101, the signal input between input terminals 111a and 112a is filtered and then experiences impedance transformation so as to be output between output terminals 111b and 112b.

Conventionally, in forming an input-output balanced filter 101, an inductor and a capacitor, which are discrete components, are arranged to be connected via a circuit pattern disposed on a printed circuit board or the like. This causes the size (the occupied area) of the filter 101 to be greatly increased, thereby preventing reduction in size or miniaturization of the device. Another more serious disadvantage is that variations in respective electric constants of the discrete components cause a balanced transmission characteristic of the input-output balanced filter 101 to deteriorate significantly. Also, since the electric constants of the discrete components are usually set by ranking of specified values, it is difficult to make fine adjustments to the electric constants of the components so that a desirable characteristic can be obtained. Another problem is that there are fluctuations in the characteristic of the filter 101 depending on the condition in which the discrete components are mounted.

SUMMARY OF THE INVENTION

To overcome the problems described above, preferred embodiments of the present invention provide an input-output balanced filter, which has a greatly reduced size and, excellent and extremely stable electric characteristics while still allowing for very fine adjustment of the electric characteristics of the filter.

In order to provide such an improved filter according to preferred embodiments of the present invention, an input-output balanced filter includes a first LC bandpass filter circuit unit and a second LC bandpass filter circuit unit, in which a common side line of the first LC bandpass filter circuit unit and a common side line of the second LC bandpass filter circuit unit are electrically connected to each other via a common line.

The novel arrangement described above permits the approximate midpoint of the common line to be a phase reference point, so that the first LC bandpass filter circuit unit and the second LC bandpass filter circuit unit have a common phase reference point. As a result, this novel arrangement controls fluctuations in a phase characteristic of the input-output balanced filter.

Furthermore, in the input-output balanced filter according to preferred embodiments of the present invention, a layered structure is provided and includes a plurality of insulating layers, a plurality of first coil conductive patterns and first capacitor conductive patterns, a plurality of second coil conductive patterns and second capacitor conductive patterns, and a common line conductive pattern, in which a first LC bandpass filter circuit unit includes the first coil conductive patterns and the first capacitor conductive patterns, while a second LC bandpass filter circuit unit includes the second coil conductive patterns and the second capacitor conductive patterns, and the common side line of the first LC bandpass filter circuit unit and the common side line of the second LC bandpass filter circuit unit are electrically connected to each other via the common line conductive pattern. In this novel arrangement, the common line conductive pattern is disposed inside of and arranged on the surface of the layered structure to have an axially symmetrical arrangement.

Thus, the novel arrangement described above permits the first LC bandpass filter circuit unit and the second LC bandpass filter circuit unit to be formed in a single layered structure, which allows the size of the filter to be greatly reduced and significantly miniaturized. Further, the electric constants of the inductors and the capacitors defining the first and second LC bandpass filter circuit units and the electric characteristics of the common line are determined by geometric configurations and sizes of the coil conductive pattern, the capacitor conductive pattern, and the common line conductive pattern. Therefore, modifications of these conductive patterns permit design parameters of the filter to be freely selected, resulting in a greatly increased freedom of design of the filter.

BRIEF DESCRIPTION OF THE DRAWINGS

FIG. 3 is a perspective view showing an appearance of the input-output balanced filter shown in FIG. 2;

FIG. 4 is a perspective view showing a first modification of a common line conductive pattern shown in FIG. 2;

FIG. 5 is a perspective view showing a second modification of a common line conductive pattern shown in FIG. 2;

FIG. 6 is a perspective view showing a third modification of a common line conductive pattern shown in FIG. 2;

FIG. 7 is a perspective view showing a fourth modification of a common line conductive pattern shown in FIG. 2;

FIG. 8 is a graph indicating attenuation characteristics of the filter when the common line conductive pattern is modified;

FIG. 9 is an electric equivalent circuit diagram of an input-output balanced filter according to a second preferred embodiment of the present invention;

FIG. 10 is an exploded perspective view showing a structure of the input-output balanced filter shown in FIG. 9;

FIG. 11 is a perspective view showing an appearance of the input-output balanced filter shown in FIG. 10.

FIG. 12 is a perspective view showing a third preferred embodiment of the input-output balanced filter according to the present invention; and FIG. 13 is an electric equivalent circuit diagram of a conventional type of an input-output balanced filter.

DETAILED DESCRIPTION OF PREFERRED EMBODIMENTS

Figure 1:
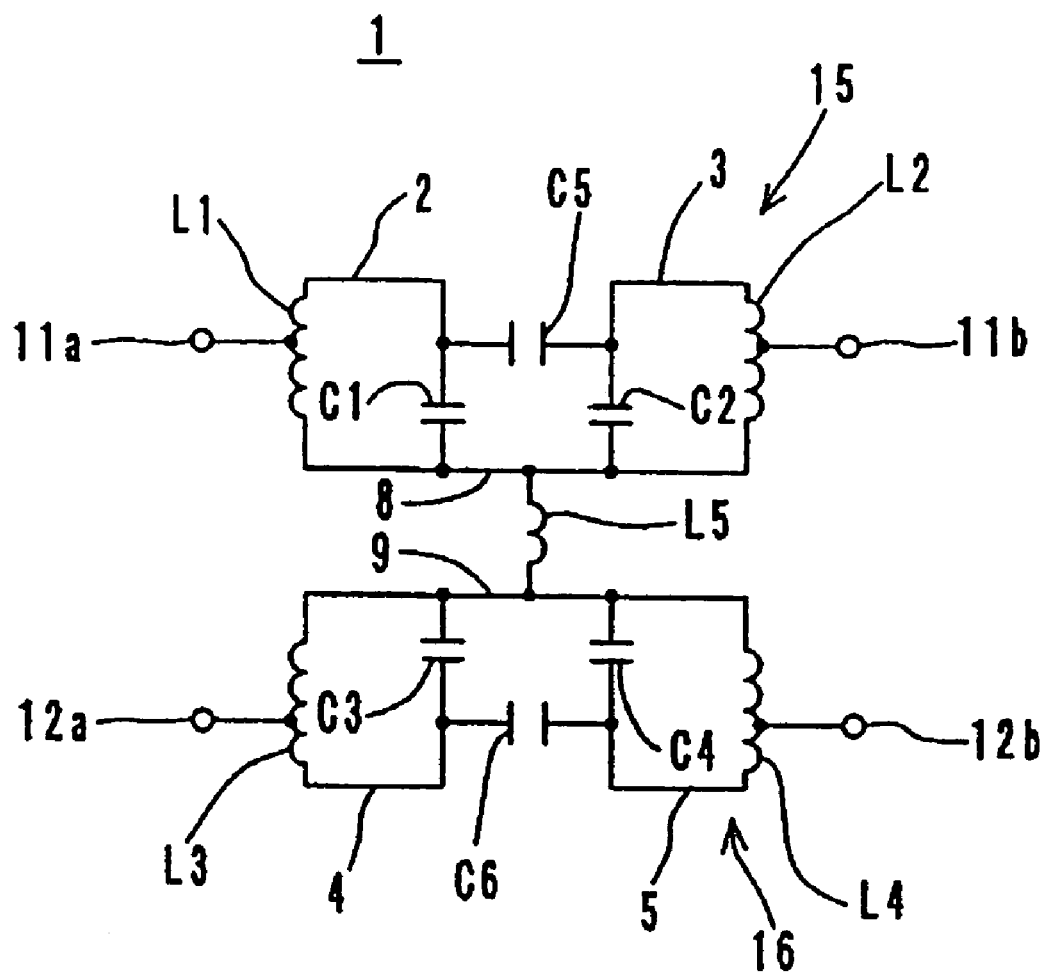
FIG. 1 is an electric equivalent circuit diagram of an input-output balanced filter according to a first preferred embodiment of the present invention.

Referring now to the drawings attached hereto, a description will be given of an input-output balanced filter according to preferred embodiments of the present invention. The preferred embodiments have common reference numerals for the same components and portions.

FIG. 1 shows a circuit structure of a first preferred embodiment of an input-output balanced filter according to the present invention. The input-output balanced filter 1 preferably has at least two LC bandpass filter circuit units 15 and 16, which function as band-pass filters. The LC bandpass filter circuit unit 15 has a circuit structure in which a LC parallel resonant circuit 2 including an inductor L1 and a capacitor C1 and a LC parallel resonant circuit 3 including an inductor L2 and a capacitor C2 are connected to each other via a connecting capacitor C5, while the LC filter circuit unit 16 has a circuit structure in which a LC parallel resonant circuit 4 including an inductor L3 and a capacitor C3 and a LC parallel resonant circuit 5 including an inductor L4 and a capacitor C4 are connected to each other via a connecting capacitor C6.

In an input-output balanced filter, the central frequency of the LC bandpass filter circuit unit 15 is designed to be the same as that of the LC bandpass filter circuit unit 16.

An input terminal 11a of the LC bandpass filter circuit unit 15 is connected to the approximate midpoint (a center tap) of the inductor L1 of the LC parallel resonant circuit 2, while an output terminal 11b of the LC bandpass filter circuit unit 15 is connected to the approximate midpoint (a center tap) of the inductor L2 of the LC parallel resonant circuit 3. Similarly, an input terminal 12a of the LC bandpass filter circuit unit 16 is connected to an approximate midpoint (a center tap) of the inductor L3 of the LC parallel resonant circuit 4, while an output terminal 12b of the LC bandpass filter circuit unit 16 is connected to the approximate midpoint (a center tap) of the inductor L4 of the LC parallel resonant circuit 5. Also, a common side line 8 of the LC bandpass filter circuit unit 15 and a common side line 9 of the LC bandpass filter circuit unit 16 are connected to each other via a connecting inductor L5.

Figure 2:
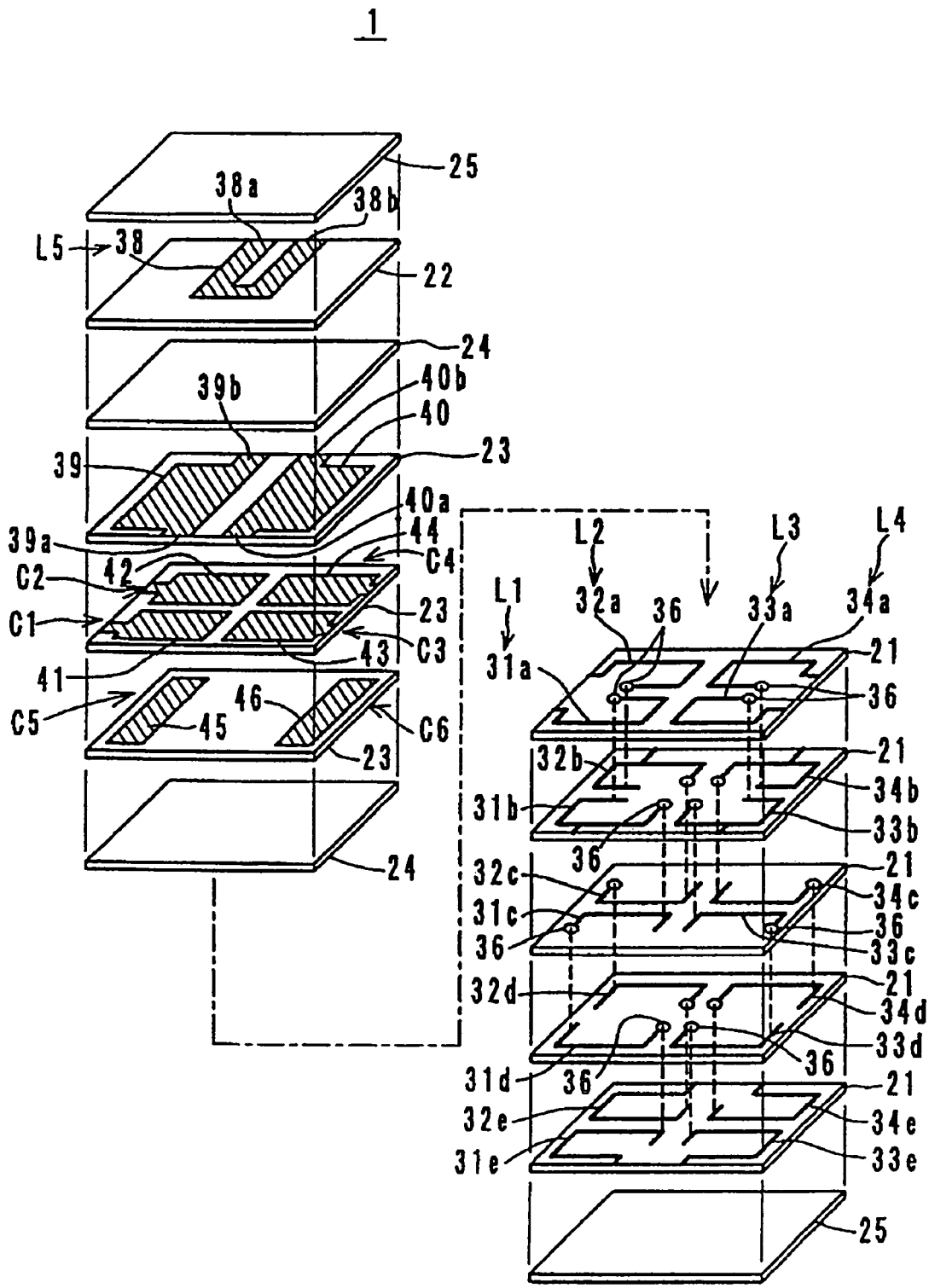
FIG. 2 is an exploded perspective view showing a structure of the input-output balanced filter shown in FIG. 1.

FIG. 2 shows a detailed structure of the input-output balanced filter 1, which is preferably a surface-mount type having the circuit structure shown in FIG. 1. The inductors L1 and L2 of the LC parallel resonant circuits 2 and 3, which define the LC bandpass filter circuit unit 15, and the inductors L3 and L4 of the LC parallel resonant circuits 4 and 5 which define the LC bandpass filter circuit unit 16 include coil conductive patterns 31a to 31e, 32a to 32e, 33a to 33e, and 34a to 34e, which are disposed on insulating ceramic sheets 21. The capacitors C1 and C2 of the LC parallel resonant circuits 2 and 3, and the capacitors C3 and C4 of the LC parallel resonant circuits 4 and 5, and the connecting capacitors C5 and C6 include capacitor conductive patterns 39 to 46, which are disposed on insulating ceramic sheets 23.

The coil conductive patterns 31a to 31e and 32a to 32e are respectively located on the left side on the ceramic sheets 21. The coil conductive patterns 31a to 31e and 32a to 32e are electrically connected in series to each other through via holes 36 made in the ceramic sheets 21 so as to define respectively the spiral inductors L1 and L2 in the LC bandpass filter circuit unit 15.

The coil conductive patterns 33a to 33e and the coil conductive patterns 34a to 34e are respectively located on the right side on the ceramic sheets 21. The coil conductive patterns 33a to 33e and 34a to 34e are electrically connected in series to each other through the via holes 36 made in the ceramic sheets 21 so as to define respectively the spiral inductors L3 and L4 in the LC bandpass filter circuit unit 16.

Each of the coil conductive patterns 31a to 31e defining the inductor L1 is arranged on the ceramic sheets 21 symmetrically with respect to each of the coil conductive patterns 32a to 32e defining the inductor L2, and with respect to each of the coil conductive patterns 33a to 33e defining the inductor L3. In a similar manner, each of the coil conductive patterns 34a to 34e defining the inductor L4 is arranged on the ceramic sheets 21 symmetrically with respect to each of the coil conductive patterns 32a to 32e defining the inductor L2, and with respect to each of the coil conductive patterns 33a to 33e defining the inductor L3. As a result, the winding direction of the inductor L1 is reverse relative to the winding directions of the inductors L2 and L3, while the winding direction of the inductor L1 is in the same direction as that of the inductor L4. In other words, mutually adjacent inductors have a winding direction (reverse direction) arranged to cooperatively intensify the magnetic field, while the inductors diagonally opposing each other on the sheets 21 have a winding direction (same direction) arranged to cooperatively weaken the magnetic field. This greatly enhances the balanced transmission characteristic of the filter 1.

Capacitor conductive patterns 39, 41, 42, and 45 are respectively located on the left side on the surface of the ceramic sheets 23. The capacitor conductive patterns 39 and 41 define a capacitor C1 of the LC bandpass filter circuit unit 15; the capacitor conductive patterns 39 and 42 define a capacitor C2; and the capacitor conductive patterns 41, 42, and 45 define a connecting capacitor C5. In a similar manner, capacitor conductive patterns 40, 43, 44, and 46 are respectively located on the right side of the ceramic sheets 23. The capacitor conductive patterns 40 and 43 define a capacitor C3 of the LC bandpass filter circuit unit 16; the capacitor conductive patterns 40 and 44 define a capacitor C4; and the capacitor conductive patterns 43, 44, and 46 define a connecting capacitor C6. The pairs of capacitor conductive patterns including the pair of 39 and 40, the pair of 41 and 42, the pair of 43 and 44, and the pair of 45 and 46, are arranged to be axially symmetric relative to each other on the ceramic sheets 23.

An enlargement of the areas of the capacitor conductive patterns 39 to 44 and an increase in the electric capacitances of the capacitors C1 to C4 allow the center frequencies of the LC bandpass filter circuit units 15 and 16 to be reduced. Furthermore, an enlargement of the areas of the capacitor conductive patterns 45 and 46 and an increase in the electric capacitances of the connecting capacitors C5 and C6 allow a pass band width of the LC bandpass filter circuit units 15 and 16 to be increased.

A common line conductive pattern 38 is disposed on a ceramic sheet 22. The common line conductive pattern 38, which has a substantially U-shaped configuration and an axially symmetric pattern, constitutes a connecting inductor L5, which is a common line. Also, each of the ceramic sheets 21, 22, and 23, etc., preferably is a sheet in which dielectric particles and magnetic particles are mixed with a binding agent, etc. The conductive patterns 31a–34e, 38–46 are preferably made of Ag, Pd, Ag—Pd, Ni, and Cu, etc., and formed by printing, or the like.

The above-described ceramic sheets 21, 22, and 23 are laminated with a protection ceramic sheet 25 and a dummy ceramic sheet 24 disposed between them so as to be formed into a layered structure 50 by sintering to form an integral unit. The input terminal 11a and a relay terminal 51 of the LC bandpass filter circuit unit 15, and the input terminal 12a and a relay terminal 52 of the LC bandpass filter circuit unit 16 are provided on the front side of the layered structure 50. The output terminal 11b and a relay terminal 53 of the LC bandpass filter circuit unit 15, and the output terminal 12b and a relay terminal 54 of the LC bandpass filter circuit unit 16 are provided on the back side of the layered structure 50. Relay terminals 55 and 56 of the LC bandpass filter circuit unit 15 are provided on the left side of the layered structure 50 and relay terminals 57 and 58 of the LC bandpass filter circuit unit 16 are provided on the right side of the layered structure 50.

The input terminal 11a of the LC bandpass filter circuit unit 15 is connected to an extension which extends from an approximate midpoint of the coil conductive pattern 31b, while the output terminal 11b is connected to an extension which extends from an approximate midpoint of the coil conductive pattern 32b. The input terminal 12a of the LC bandpass filter circuit unit 16 is connected to an extension which extends from an approximate midpoint of the coil conductive pattern 33b, while the output terminal 12b is connected to an extension which extends from an approximate midpoint of the coil conductive pattern 34b. In other words, the input terminals 11a and 12a, and the output terminals 11b and 12b are respectively connected to the approximate midpoints of the inductors L1, L2, L3, and L4 for the purpose of matching impedance between them and the external circuit, so as to locate center taps. Usually, the inductors L1 to L4 are set at high impedance in advance, and the locations of the center taps are set at approximate midpoints of the inductors L1 to L4. Moving the locations of the center taps permits a value of input-output impedance of the filter 1 to be changed to a desired one. More specifically, when the locations of the center taps are moved onto the capacitor conductive patterns 41 to 44, the input-output impedance of the filter 1 is reduced.

The relay terminal 51 of the LC bandpass filter circuit unit 15 is connected to an end of the inductor L1 (namely, an end of the coil conductive pattern 31e) and an end of the capacitor C1 (namely, an edge 39a of the capacitor conductive pattern 39). The relay terminal 55 is connected to the other end of the inductor L1 (namely, an-end of the coil conductive pattern 31a) and the other edge of the capacitor C1 and an edge of the connecting capacitor C5 (namely, an edge of the capacitor conductive pattern 41). The relay terminal 56 is connected to an end of the inductor L2 (namely, an end of the coil conductive pattern 32a), an edge of the capacitor C2 and the other edge of the connecting capacitor C5 (namely, an edge of the capacitor conductive pattern 42). The relay terminal 53 is connected to the other end of the inductor L2 (namely, an end of the coil conductive pattern 32e), an end of the connecting inductor L5 (namely, an end 38a of the common line conductive pattern 38), and the other edge of the capacitor C2 (namely, the other edge 39b of the capacitor conductive pattern 39).

Similarly, the relay terminal 52 of the LC bandpass filter circuit unit 16 is connected to an end of the inductor L3 (namely, an end of the coil conductive pattern 33e) and an edge of the capacitor C3 (namely, an edge 40a of the capacitor conductive pattern 40). The relay terminal 57 is connected to the other end of the inductor L3 (namely, an end of the coil conductive pattern 33a), the other edge of the capacitor C3, and an end of the connecting capacitor C6 (namely, an edge of the capacitor conductive pattern 43). The relay terminal 58 is connected to an end of the inductor L4 (namely, an end of the coil conductive pattern 34a), an edge of the capacitor C4, and the other edge of the connecting capacitor C6 (namely, an edge of the capacitor conductive pattern 44). The relay terminal 54 is connected to the other end of the inductor L4 (namely, an end of the coil conductive pattern 34e), the other end of the connecting inductor L5 (namely, the other end 38b of the common line conductive pattern 38), and the other edge of the capacitor C2 (namely, the other edge 40b of the capacitor conductive pattern 40).

The common side line 8 of the LC bandpass filter circuit unit 15 is defined by the relay terminals 51 and 53, and the capacitor conductive pattern 39, while the common side line 9 of the LC bandpass filter circuit unit 16 is defined by the relay terminals 52 and 54, and the capacitor conductive pattern 40. The common lines 8 and 9 are electrically connected to each other via the common line conductive pattern 38.

In the input-output balanced filter 1 having such a novel arrangement, the approximate midpoint of the common line conductive pattern 38 is a phase reference point of each of the LC bandpass filter circuit units 15 and 16. Thus, since the LC bandpass filter circuit units 15 and 16 have a common phase reference point, fluctuations in the phase characteristic of the filter 1 can be suppressed. Moreover, modifications of the geometric shape and size of the common line conductive pattern 38 allow a pole position in the attenuation characteristic of the filter 1 to be shifted. For instance, making a modification to the shapes of common line conductive patterns 38A and 38B to provide convex shapes as shown in FIGS. 4 and 5, or making a modification to the shapes of common line conductive patterns 38C and 38D to provide substantially H-shaped members as shown in FIGS. 6 and 7, allows the pole position to be shifted as shown in FIG. 8. In FIG. 8, a curve A1 indicates the attenuation characteristic of the filter 1 having the common line conductive pattern 38 shown in FIG. 2; a curve A2 indicates the attenuation characteristic of the filter having the common line conductive pattern 38A shown in FIG. 4; a curve A3 indicates the attenuation characteristic of the filter having the common line conductive pattern 38B shown in FIG. 5; a curve A4 indicates the attenuation characteristic of the filter having the common line conductive pattern 38C shown in FIG. 6; and a curve A5 indicates the attenuation characteristic of the filter having the common line conductive pattern 38D shown in FIG. 7.

Since the inductors L1 to L5 and the capacitors C1 to C6 constituting the LC bandpass filter circuit units 15 and 16 are constructed to have integral unit layered structure 50, a compact input-output balanced filter 1 which occupies substantially less area when mounted on a printed circuit board is obtained. Moreover, since the ambient temperature with respect to the LC bandpass filter circuit units 15 and 16, and the operational conditions in a mounted state of the LC bandpass filter circuit units 15 and 16 are substantially equal, an input-output balanced filter 1 having a stable characteristic can be obtained. Also, each electric constant of the inductors L1 to L4 and the capacitors C1 to C6 defining the LC bandpass filter circuit units 15 and 16, and the electric characteristic of the connecting inductor L5 are determined by the geometric shapes and sizes of the coil conductive patterns 31a to 34e, the capacitor conductive patterns 39 to 46, and the common line conductive pattern 38. Therefore, only modifications of the conductive patterns 31a to 34e, and the like, permit a free selection of the design parameters of the filter 1 and easy changes to the design of the filter.

Furthermore, since the conductive patterns 31a–32e, 39, 41, 42, and 45, which define the LC bandpass filter circuit unit 15, and the conductive patterns 33a–34e, 40, 43, 44, and 46, which define the LC bandpass filter circuit unit 16, are juxtaposed on the sheets 21 and 23 so as to be arranged in an axially symmetric manner, the conditions for producing the conductive patterns 31a to 34e, etc., are equal. Consequently, the obtained resonant circuit constants of the LC bandpass filter circuit units 15 and 16 are substantially equal, and moreover, since the common line conductive pattern 38 has an axially symmetric arrangement, an input-output balanced filter 1 having excellent, stable and well balanced transmission characteristics is obtained.

FIG. 9 shows a circuit structure of an input-output balanced filter of a second preferred embodiment according to the present invention; FIG. 10 shows an exploded perspective view of the detailed structure of the same; and FIG. 11 shows the appearance of the perspective view of the same. The input-output balanced filter 61 is formed in such a manner that input and output are performed by the capacitors C7, C8, C9, and C10, instead of performing input and output via center taps as in the input-output balanced filter 1 of the first preferred embodiment described above.

The capacitors C7–C10 for performing input and output include capacitor conductive patterns 41a to 44a, 41b to 44b, and 71 to 74 on the ceramic sheets 23, as shown in FIG. 10. More specifically, the capacitor conductive patterns 71, 41a, and 41b define the capacitor C7, the capacitor conductive patterns 72, 42a, and 42b define the capacitor C8, the capacitor conductive patterns 73, 43a, and 43b define the capacitor C9, and the capacitor conductive patterns 74, 44a, and 44b define the capacitor C10.

The edge of the capacitor conductive pattern 71 is connected to the input terminal 11a; the edge of the capacitor conductive pattern 72 is connected to the output terminal 11b; the edge of the capacitor conductive pattern 73 is connected to the input terminal 12a; the edge of the capacitor conductive pattern 74 is connected to the output terminal 12b; the edges of the capacitor conductive patterns 41a and 41b are connected to the relay terminal 55; the edges of the capacitor conductive patterns 42a and 42b are connected to the relay terminal 56; the edges of the capacitor conductive patterns 43a and 43b are connected to the relay terminal 57; and the edges of the capacitor conductive patterns 44a and 44b are connected to the relay terminal 58. This novel arrangement permits impedance on the input and output sides of the filter 61 to be reduced, leading to an increase in the freedom in design of the input-output impedance.

FIG. 12 shows a perspective view of an input-output balanced filter of a third preferred embodiment according to the present invention. In the input-output balanced filter 81, the common line conductive pattern 38 used in the input-output balanced filter of the first preferred embodiment is eliminated, and as an alternative to that, a common line conductive pattern 82 is disposed on the side surface of the layered structure 50. The relay terminals 53 and 54 are electrically connected to each other via the common line conductive pattern 82 with almost no function as an inductor.

In the input-output balanced filter 81 having such an arrangement, the approximate midpoint of the common line conductive pattern 82 is the phase reference point of each of the LC bandpass filter circuit units 15 and 16. Thus, since the LC bandpass filter circuit units 15 and 16 have a common phase reference point, fluctuations in the phase characteristic of the filter 81 are significantly suppressed. In addition, if the common line conductive pattern 82 has a function as an inductor, a partial cutting-off of the common line conductive pattern 82 by means of trimming via a laser or the like permits fine adjustments of the characteristic of the filter even after commercialization of the product.

The input-output balanced filter according to the present invention is not restricted to the preferred embodiments above, and can be modified in various forms within the scope of the invention.

When impedance between the external circuit connected to the input side of the filter and the external circuit connected to the output side of the filter is different, for example, in order to perform input of the filter, a center tap may be used, while a capacitor may be used in order to perform output.

Further, in the above embodiments, although the LC bandpass filter circuit units are constructed by connecting the LC parallel resonant circuits through the connecting capacitor, the LC parallel resonant circuits may be electromagnetically connected.

For example, they may be connected by both a connecting inductor and a connecting capacitor. Further, conductive patterns can be omitted, and the LC bandpass filter circuit units are not restricted to the multi-staged LC parallel resonant circuits.

Furthermore, in the preferred embodiments described above, the sheets are laminated to be sintered in an integrated manner, but other methods are also applicable. For example, sheets which have been sintered in advance can be used. Also, the filter can be produced by a method described as follows: an insulating material in the form of a paste is applied via a printing method, or the like, then the material is dried to form an insulating film, and a conductive material in the form of a paste is applied on the surface of the insulating film and dried so as to form a coil conductive pattern and a capacitor conductive pattern. Such a method of laminating sheets one by one can create a filter with a layered structure.

As clearly seen from the description above, in the present invention, the approximate midpoint of the common line defines each phase reference point of the first and second LC bandpass filter circuit units. As a result, the two filters have a common phase reference point, so that an input-output balanced filter having excellent, stable and reduced-fluctuation phase characteristics is obtained. Moreover, modifications of the geometric shape and size of the common line conductive pattern 38 permit the pole position in the attenuation characteristic of the filter 1 to be easily shifted.

In addition, since the first and second LC bandpass filter circuit units are contained in the single layered structure, it is possible to obtain a compact input-output, balanced filter which occupies significantly less area when mounted on a printed circuit board. Also, since the ambient temperature with respect to the first and second LC bandpass filter circuit units, and the operational conditions in a mounted state of these LC bandpass filter circuit units are substantially equal, an input-output balanced filter having a stable characteristic can be obtained. Furthermore, the electric constants of the inductors and the capacitors defining the first and second LC bandpass filter circuit units and the electric characteristics of the common line are determined by geometric configurations and sizes of the coil conductive pattern, the capacitor conductive pattern, and a common line conductive pattern. Therefore, only modifications of these conductive patterns permits design parameters of the filter to be freely selected, resulting in facilitation of changes in design of the filter.

Furthermore, since the conductive patterns, which respectively define the first LC bandpass filter circuit unit and the second LC bandpass filter circuit unit, are juxtaposed on the insulating layer so as to be arranged in an axially symmetric manner, the conditions for producing the conductive patterns become equal. Consequently, the resulting resonant circuit constants of the first and second LC bandpass filter circuit units are substantially equal, and moreover, since the common line conductive pattern has an axially symmetric arrangement, an input-output balanced filter having excellent, stable and well-balanced transmission characteristics is obtained.

While the invention has been particularly shown and described with reference to preferred embodiments thereof, it will be understood by those skilled in the art that the forgoing and other changes in form and details may be made therein without departing from the spirit of the invention.

What is claimed is:

1. An input-output balanced filter comprising:
   first and second input terminals and first and second output terminals;
   a first LC filter circuit unit including a common side line defined by at least one first relay terminal and a first capacitor conductive pattern, said first LC filter circuit unit being connected between said first input terminal and said first output terminal;
   a second LC filter circuit unit including a common side line defined by at least one second relay terminal and a second capacitor conductive pattern, said second LC filter circuit unit being connected between said second input terminal and said second output terminal;
   a common line;
   wherein said common side line of said first LC filter circuit unit is electrically and directly connected to said common side line of said second LC filter circuit unit via said common line; and
   the first LC filter circuit unit is electromagnetically independent from the second LC filter circuit unit.

2. The input-output balanced filter according to claim 1, wherein the first LC filter circuit unit includes at least one LC parallel resonant circuit.

3. The input-output balanced lifter according to claim 1, wherein the first LC filter circuit unit includes at least two LC parallel resonant circuits.

4. The input-output balanced filter according to claim 1, wherein the second LC filter circuit includes at least one LC parallel resonant circuit.

5. The input-output balanced filter according to claim 1, wherein the second LC filter circuit unit includes at least two parallel resonant circuits.

6. The input-output balanced filter according to claim 1, wherein said common line includes at least one inductor.

7. The input-output balanced filter according to claim 1, wherein said filter has a layered unit structure and said common line is disposed inside of said layered unit structure.

8. The input-output balanced filter according to claim 1, wherein said filter has a layered unit structure and said common line is disposed on a surface of said layered unit structure.

9. The input-output balanced filter according to claim 1, wherein each phase reference point of the first LC filter circuit unit and the second LC filter circuit unit exists on the common line.

10. An input-output balanced filter comprising:
    a plurality of insulating layers;
    first and second input terminals and first and second output terminals;
    a first LC filter circuit unit connected between said first input terminal and said first output terminal and having a plurality of first coil conductive patterns, first capacitor conductive patterns and a common side line defined by at least one first relay terminal and one of the first capacitor conductive patterns;
    a second LC filter circuit unit connected between said second input terminal and said second output terminal and having a plurality of second coil conductive patterns, second capacitor conductive patterns and a common side line defined by at least one second relay terminal and one of the second capacitor conductive patterns; and
    a common line conductive pattern;
    wherein said common side line of said LC filter circuit unit is electrically and directly connected to said common side line of said second LC filter circuit unit via said common line conductive pattern; and
    the first LC filter circuit unit is electromagnetically independent from the second LC filter circuit unit.

11. The input-output balanced filter according to claim 10, wherein the first LC filter circuit unit includes at least one LC parallel resonant circuit.

12. The input-output balanced filter according to claim 10, wherein the first LC filter circuit unit includes at least two LC parallel resonant circuits.

13. The input-output balanced filter according to claim 10, wherein the second LC filter circuit unit includes at least two parallel resonant circuits.

14. The input-output balanced filter according to claim 10, wherein said common line includes at least one inductor.

15. An input-output balanced filter according to claim 10, wherein said filter has a layered unit structure and said common line conductive pattern is disposed inside of said layered unit structure.

16. An input-output balanced filter according to claim 10, wherein said filter has a layered unit structure and said common line conductive pattern is disposed on a surface of said layered unit structure.

17. An input-output balanced filter according to claim 10, wherein said common line conductive pattern has an axially symmetric pattern.

18. The input-output balanced filter according to claim 10, wherein each phase reference point of the first LC filter circuit unit and the second LC filter circuit unit exists on the common line conductive pattern.

19. An input-output balanced filter comprising:
    a first LC bandpass filter circuit unit including a plurality of LC parallel resonant circuits electromagnetically connected to one another and having a common side line defined by at least one first relay terminal and a first capacitor conductive pattern;
    a second LC bandpass filter circuit unit including a plurality of LC parallel resonant circuits electromagnetically connected to one another and having a common side line defined by at least one second relay terminal and a second capacitor conductive pattern;
    an inductor for electrically and directly connecting said common side line of the first LC bandpass filter circuit unit to said common side line of the second LC bandpass filter circuit unit;

first and second input terminals provided with one of the LC parallel resonant circuits of the first LC bandpass filter circuit unit and one of the LC parallel resonant circuits of the second LC bandpass filter circuit unit, respectively; and first and second output terminals provided with another of the LC parallel resonant circuits of the first LC bandpass filter circuit unit and another of the LC parallel resonant circuits of the second LC bandpass filter circuit unit, respectively; wherein the first LC bandpass filter circuit unit is electromagnetically independent from the second LC bandpass filter circuit unit.

20. The input-output balanced filter according to claim 19, wherein each phase reference point of the first LC bandpass filter circuit unit and the second LC bandpass filter circuit unit exists on the inductor.

* * * * *